United States Patent [19]

Horiba et al.

[11] Patent Number: 4,682,301

[45] Date of Patent: Jul. 21, 1987

[54] DIGITAL FILTER FOR PROCESSING TWO-DIMENSIONAL DIGITAL IMAGE

[75] Inventors: Isao Horiba, Kariya; Ken Ishikawa, Matsudo, both of Japan

[73] Assignee: Hitachi Medical Corp., Japan

[21] Appl. No.: 871,246

[22] Filed: Jun. 6, 1986

Related U.S. Application Data

[63] Continuation of Ser. No. 528,248, Aug. 31, 1983, abandoned.

[30] Foreign Application Priority Data

Sep. 2, 1982 [JP] Japan .................. 57-151804

[51] Int. Cl.[4] .................. G06F 15/31; H01J 40/14
[52] U.S. Cl. .................. 364/724; 382/54
[58] Field of Search .................. 364/724; 382/54; 358/166

[56] References Cited

U.S. PATENT DOCUMENTS

| | | |
|---|---|---|
| 4,328,426 | 5/1982 | D'Ortenzio .................. 364/724 |
| 4,339,803 | 7/1982 | Michael et al. .................. 364/724 |
| 4,437,122 | 3/1984 | Walsh et al. .................. 358/166 |
| 4,463,381 | 7/1984 | Powell et al. .................. 358/166 |
| 4,507,681 | 3/1985 | Verhoeven et al. .................. 358/166 |
| 4,602,285 | 7/1986 | Beaulier et al. .................. 364/724 |

Primary Examiner—David H. Malzahn
Attorney, Agent, or Firm—Gerald J. Ferguson, Jr.; Michael P. Hoffman; Ronni S. Malamud

[57] ABSTRACT

Digital filters can be very effectively used for filtration of two-dimensional image. A special one of the digital filters operates to add together all data over a filter length, multiply the addition result by a predetermined set value, and to effect addition or subtraction between the multiplication result and data at a point of interest to be filtered. In case of the addition, the filter works as a low-pass filter. In case of the subtraction, the filter provides for a high-pass filtration. Such digital filter has such a problem that the number of additions is increased as the filter length is larger. Therefore, it is essential in the digital filters to reduce the necessary number of additions.

21 Claims, 14 Drawing Figures

FIG. I
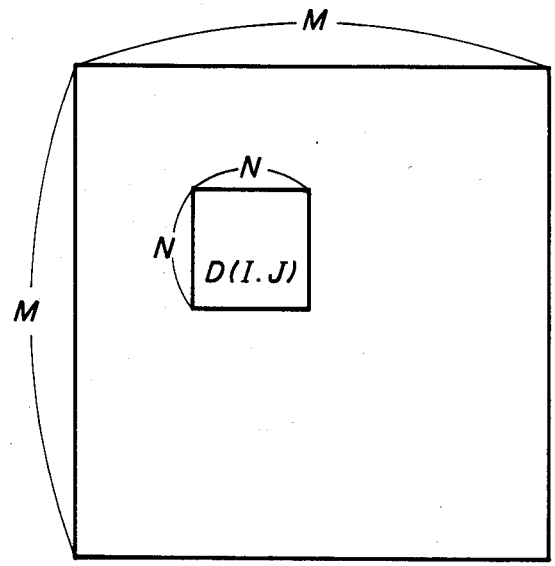
FIG. 2A
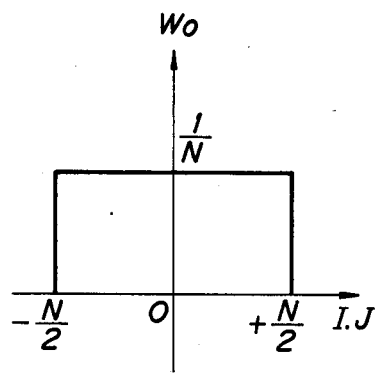
FIG. 2B
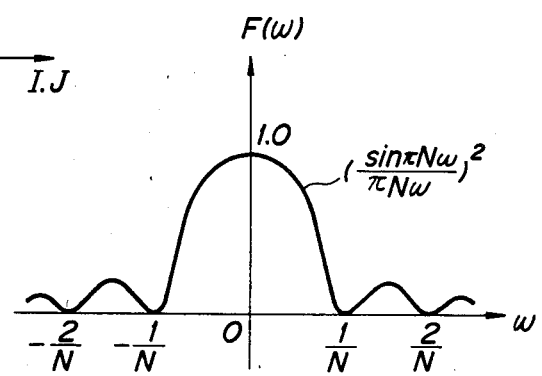

DIGITAL FILTER FOR PROCESSING TWO-DIMENSIONAL DIGITAL IMAGE

This application is a continuation of Ser. No. 528,248, filed Aug. 31, 1983, now abandoned.

BACKGROUND OF THE INVENTION (a) Field of the Invention

The present invention generally relates to a transfer network used in electrical systems for the selective enhancement of a given class of input signals, and more particularly to a digital filter for filtering an M-by-M pixels matrix of a two-dimensional digital image in a filter having an N-by-N (N<M) filter length while raster-scanning the matrix.

(b) Description of the Prior Art

Generally known for filtration of a digital image are three types of filters. The first is a high-pass filter that eliminates or attenuates all frequencies lower than a given cutoff frequency, resulting in substantial enhancement of all other frequencies above the cutoff frequencies. Another is a low-pass filter to enhance all frequencies below a given cutoff frequency while substantially eliminating or attenuating all other frequencies above the cutoff frequency. The third type of filter is a band-pass filter that eliminates or attenuates all frequencies both below and above a given band pass, resulting in a substantial enhancement of the band of frequencies of interest. These filters are used for adjusting the quality of a digital image for any intended purpose of the image. For example, in the field of medical imaging, the purpose of such an image exists in the medical diagnosis of an object under examination. In this field of technique, the filtration is done for improvement of the image quality to thus facilitate diagnosis. A digital image is yielded from a combination of differential densities in quantized two-dimensional spaces called "pixels". Digital filtration of a digital image consisting of, for example, M-by-M pixels will be explained below with reference to FIG. 1.

FIG. 1 depicts an image data consisting of M-by-M pixels. Assume here that data D (I, J) at each pixel point (I, J) is to be filtered. For simple filtration, there is available a method of convoluting the data D (I, J) and its surrounding data, which is expressed as (1) below:

$$Q(I,J) = D(I,J) + \frac{1}{N^2} \sum_{k=-\left(\frac{N}{2}\right)}^{\left(\frac{N}{2}\right)} \sum_{l=-\left(\frac{N}{2}\right)}^{\left(\frac{N}{2}\right)} W(k,l) \cdot D(I+k, J+l) \quad (1)$$

where D (I, J) is an image datum at the coordinate point (I, J), N is an odd number and the symbol [ ] represents the Gaussian operation, i.e., the emission of digit below the first decimal place. In case N is an even number this filtration is carried out approximately as follows:

$$Q(I,J) = D(I,J) + \frac{1}{N^2} \sum_{k=-\left(\frac{N}{2}\right)-1}^{\left(\frac{N}{2}\right)} \sum_{l=-\left(\frac{N}{2}\right)-1}^{\left(\frac{N}{2}\right)} W(k,l) \cdot D(I+k, J+l) \quad (1)'$$

$$Q(I,J) = D(I,J) + \frac{1}{N^2} \sum_{k=-\left(\frac{N}{2}\right)+1}^{\left(\frac{N}{2}\right)} \sum_{l=-\left(\frac{N}{2}\right)-1}^{\left(\frac{N}{2}\right)} W(k,l) \cdot D(I+k, J+l) \quad (1)''$$

$$Q(I,J) = D(I,J) + \frac{1}{N^2} \sum_{k=-\left(\frac{N}{2}\right)-1}^{\left(\frac{N}{2}\right)} \sum_{l=-\left(\frac{N}{2}\right)}^{\left(\frac{N}{2}\right)+1} W(k,l) \cdot D(I+k, J+l) \quad (1)'''$$

$$Q(I,J) = D(I,J) + \frac{1}{N^2} \sum_{k=-\left(\frac{N}{2}\right)+1}^{\left(\frac{N}{2}\right)} \sum_{l=-\left(\frac{N}{2}\right)}^{\left(\frac{N}{2}\right)+1} W(k,l) \cdot D(I+k, J+l) \quad (1)''''$$

It should be noted that the following description about filtration is based on the expression (1) where N is an odd number, since the differences among the above-mentioned cases are not essential in the present invention. A weight function W for each of all $N^2$ data in an area of N by N is multiplied by its respective datum, and the products thus obtained are summed. The result is divided by $N^2$ and added to the original data D, thus yielding a fitration result Q (I, J). The image quality thus attained with the filtration result Q (I, J) is adjusted according to the characteristic of the weight function W in the right side of the expression (1) and the area size N of that weight function as well. By this method of filtration, the expression (1) leads to a number of multiplications and additions-that is M by M by N by N. Thus, this method necessitates a large number of calculations, which is not practical. To avoid this, the expression is further simplified for the purpose of the digital filtration. With the assumption that the W (k, l) in the expression (1) has a constant value, the following expression (2) is given:

$$W(k, l) = K \quad (2)$$

where $K \geq -1$. Thus, the expression (1) for the filtration is given as follows:

$$Q(I,J) = D(I,J) + \quad (3)$$

$$\frac{K}{N^2} \sum_{k=-\left(\frac{N}{2}\right)}^{\left(\frac{N}{2}\right)} \sum_{l=-\left(\frac{N}{2}\right)}^{\left(\frac{N}{2}\right)} D(I+k, J+l)$$

Since the expression omits the multiplication from the necessary multiplication and summing for the expression (1) and the filtration can be effected with only addition, the number of calculations can be reduced.

In the right side of the expression (3), all $N^2$ data in an area of N by N around the coordinates (I, J) are added together, and the total sum is divided by $N^2$ for a mean value of the N-by-N data. The mean value is multiplied by a constant K that is a weight factor for the mean value. Thus, in the right side of the expression (3), a value obtained from the multiplication of the mean value by the weight factor K is added to the data D (I, J) at the coordinate point (I, J). The value Q (I, J) thus obtained is a filtration of the data D (I, J) at the point (I, J).

The filtration based on the expression (3) will be explained below.

FIG. 2 (A) shows a filtration weight function $W_0$ of a width N. The power spectrum $F(\omega)$ of this function $W_0$ is shown in FIG. 2 (B). As seen in FIG. 2 (B), the power spectrum $F(\omega)$ has a maximum value at a point of $\omega=0$ while being zero at points of $\pm 1/N$, and is attenuated repeatedly in the directions of $\pm \omega$. Therefore, the convolution by the weight function $W_0$, that is, the averaging of N data, provides for a low-pass filtration; namely, low spatial frequencies near the zero point are passed as they are, while original data of increasingly higher frequencies are more strictly inhibited from being transmitted. At the points of $\pm 1/N$, no frequencies are transmitted. For this reason, higher frequencies are transmitted when N is smaller, but as N is larger, no higher frequencies are passed. Thus, the frequency response of filtration can be varied according to the magnitude of N.

According to the expression (3), a result of the operation in FIG. 2 (B) is added in a factor K to an original data D (I, J). When the K takes a positive value, low-pass filtration takes place, while the K being negative leads to high-pass filtration. Thus, a desired image quality is obtainable by setting appropriate magnitudes of N and K. Examples of filtrations when the K is negative, namely, examples of high-pass filtrations, are shown in FIGS. 3 (A) and (B).

FIG. 3 (A) shows change in spatial frequency filtration with $K=-1$ and different values of N, while FIG. 3 (B) shows changes in spatial frequency filtration with $K=-\frac{1}{2}$ and different values of N. As shown, with a large setting of N (as shown by the direction of arrow $N_L$), the bandwith as a whole decreases, with the frequency response having a steep slope. Setting N small (as shown by the direction of arrow $N_S$) leads to an increase in bandwith so that the frequency response represents a gentle slope. Further, by altering the factor K, it is possible to change the extent of blocking the low frequencies. As shown in FIGS. 3 (A) and (B), the filter characteristic, or the power spectrum $F(\omega)$ of filtration weight function $W_0$, is greatly reduced in the domain of low frequencies, while such reduction is small is the domain of high frequencies. Thus, a high-pass filtration can be achieved. By altering the K and N parameters, it is possible to adjust the filter characteristic for a desired image quality.

FIG. 3 (C) depicts the characteristic curves of a high-pass filter with the N value kept constant and K altered. As the K value is removed from zero, the rising slope is steeper, which indicates a good high-pass filter characteristic. FIG. 3 (C) also shows the characteristic curves $l_1$, $l_2$ and $l_3$ when $K=-1$ while N is altered with the assumption that N values for the characteristic curves $l_1$, $l_2$ and $l_3$ are $N_1$, $N_2$ and $N_3$, respectively, $N_1 > N_2 > N_3$.

FIG. 4 (A) shows the characteristic curves of low-pass filtration with the K value being infinite while the N value is altered. As the N value is increases, the falling slope is correspondingly steeper. FIG. 4 (B) depicts the characteristic curves with the N value kept constant while the K value is altered. With the K value being greater, the falling slope is much steeper. FIG. 3 (C) and FIGS. 4 (A) and (B) show characteristic curves of filtration with the frequency $\omega$ being positive. With a negative $\omega$ value, symmetrical curves will be seen.

The calculation of the expression (3) necessitates N-by-N=$N^2$ additions as shown at the second term of the right side thereof. Further, the expression (3) has to be calculated for M-by-M=$M^2$ pixels. Therefore, filtration of one image necessitates $N^2$-by-$M^2$ additions. For an image used for diagnosis of a subtle diseased tissue of a patient, such as an X-ray image, the M and N are selected to be 1000 to 4000 and 100 to 250, respectively, and so the number of such additions is $10^{10}$ to $10^{12}$, which leads to a large amount of time for digital filtration using the expression (3). Heretofore, a large-scale processor was used or the N value was set to a small one for reduction of the $N^2$ value (number of additions), in order to lessen the time needed for digital filtration.

SUMMARY OF THE INVENTION

Accordingly, the present invention has an object to overcome the above-mentioned drawbacks of the conventional technique by providing a digital filter which employs a considerably reduced number additions and of which utilizes simplified hardware construction.

Briefly speaking, the digital filter for two-dimensional images according to the present invention may include a MXN buffer memory for raster-scanned data where the size of the buffer is such that the N lines (or rows) thereof correspond to the filtration weight function magnitude. Thus, the buffer has a capacity of M-by-N pixels. A one-dimensional line memory may also be included for storage of additions of data along the raster direction (having a capacity of M pixels); also included may be a register for storage of a total sum of the data on N-by-N pixels. For each new pixel datum inputted into the buffer, the one-dimensional line memory is updated, and at the same time, the data within the one-dimensional line memory updates the register which stores the total sum of the N-by-N pixel data thereby causing the register to sequentially maintain a new total sum for each new input datum. This total sum is added to or substracted from the input data, both at a constant rate, to considerably reduce the number of additions, while the number of additions or subtractions is made independent of the magnitude N of the filtration weight function, thus reducing the time required for the digital filtration. The term "addition" used here refers to that having been described with respect to the expression (3), and this addition causes the inventive digital filter to function as a low-pass filter. Also the term "subtraction" used here means the subtraction having been referred to concerning the expression (3), and this subtraction leads to the function of the digital filter as a high-pass filter.

These an other objects and advantages of the present invention will be better understood from the description made by way of example of the embodiment of digital filter according to the present invention with reference to the accompanying drawings.

BRIEF DESCRIPTION OF THE DRAWINGS

FIG. 1 is an explanatory drawing of digital filtration;

FIGS. 2 (A) and (B) show a filtration weight function and power spectrum of the weight function is a frequency domain;

DETAILED DESCRIPTION OF THE PREFERRED EMBODIMENT

Figure 5:
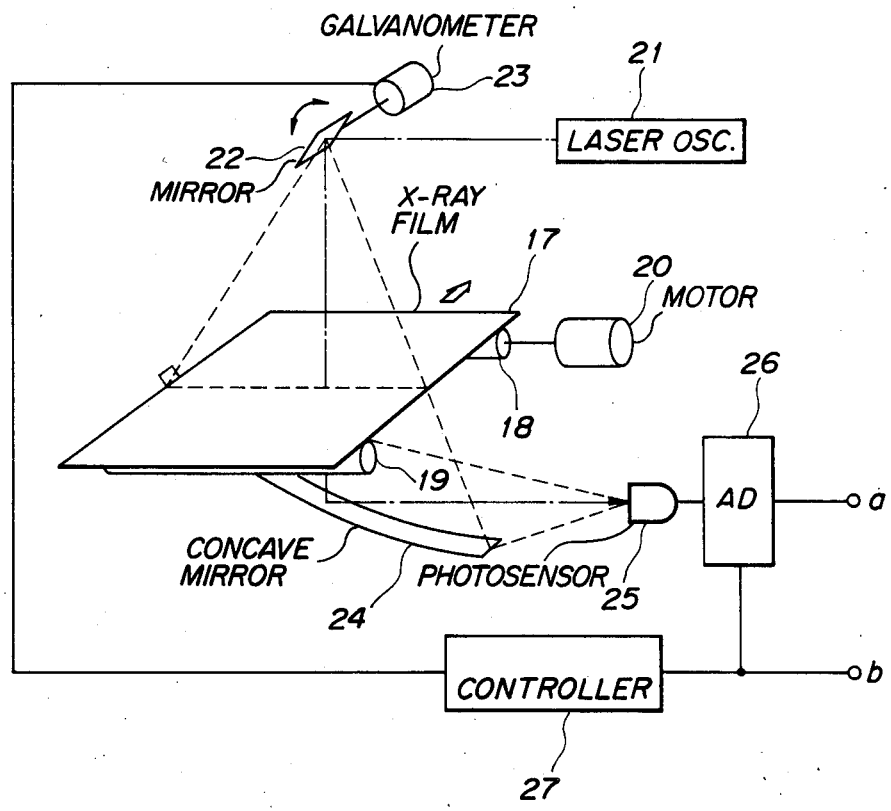
FIG. 5 shows a configuration of a system for measuring image data for entry to a digital filter according to the present invention.

FIG. 5 shows a system for measurement of image data for entry to a digital filter according to the present invention. The system of FIG. 5 reads an X-ray film 17 using a laser beam. The X-ray film 17 is supported by rollers 18 and 19 and moved by the roller 18 coupled with a motor 20 in the direction of the raster as indicated by the arrow. The laser beam emitted from a laser generator 21 is made, by a mirror 22 turned by a galvanometer 23, to scan the X-ray film. The laser beam is attenuated depending on the X-ray film density at each incident point. It is guided by a concave mirror 24 to a photosensor (photomultiplier) 25 and converted to an electrical signal.

There is provided a controller 27 to drive the galvanometer 23 at predetermined time intervals according to the conveyance of the film at a predetermined rate by means of the motor 20, while starting an analog-digital converter 26 at predetermined time intervals within the linear scan of the X-ray film by the laser beam under the action of the galvanometer 23, for thereby converting the intensity of the laser beam having penetrated through the X-ray film at each point to a digital amount which is delivered at an output a, while a signal indicative of this timing of data generation is delivered at an output b.

Figure 6:
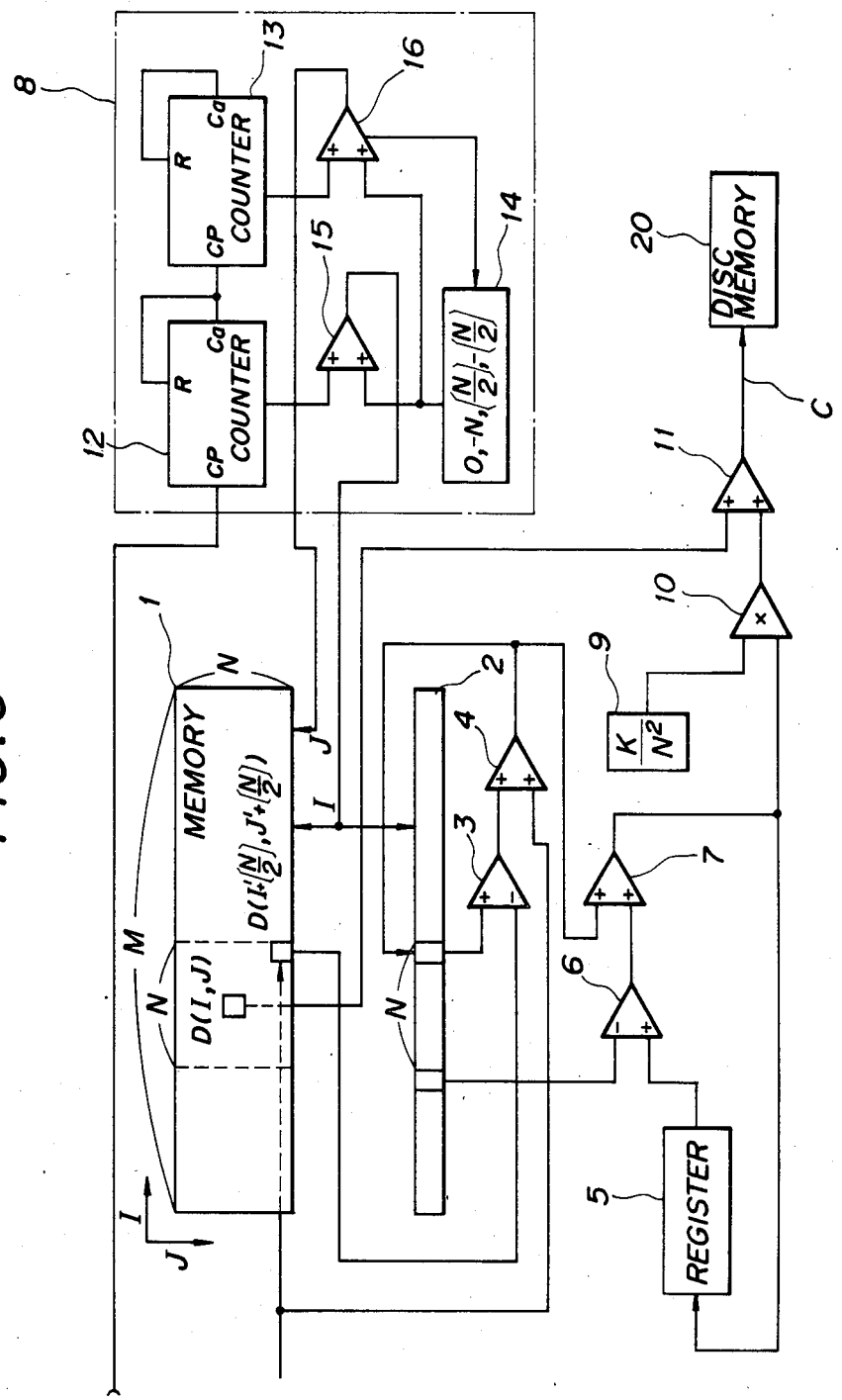
FIG. 6 shows an embodiment of the inventive digital filter.

FIG. 6 shows an embodiment of a digital filter according to the present invention for a two-dimensional digital image acquired by the raster-scan of FIG. 5.

The digital filter shown in FIG. 6 provides a high-pass or low-pass filtration of two-dimensional image data consisting of M-by-M pixels, using N-by-N (N<M) pixels in the proximity of a point of interest.

Referring now to FIG. 6, the digital filter according to the present invention comprises a memory 1 which sequentially stores two-dimensional digital image data from an input terminal a thereof obtained from the raster scan. The size of this memory 1 is M by N and the memory addresses are given by (I',J'), where (I',J') is given by the following equation at the measured date D(I,J).

$$I' = I - [N/2]$$

$$J' = J - [N/2] - [(J[N/2]/N)] \times N \quad (4)$$

In this equation the symbol [ ] shows Gaussian operation and the (I',J') is generated by an address generator 8. Image data of M by M in size are first stored at the address (1, 1), then at (2, 1), (3, 1), ... in sequence. When image data for a line are stored at the memory addresses down to (M, 1), J becomes 2. Thus, image data for a next line are stored at the memory addresses (2, 1), (2, 2), (2, 3), ... When all the M-by-N image data are stored at all the addresses of the memory 1, storage of image data for the next line are restored at the addresses (1, 1), (2, 1), (3, 1), .... This procedure of storage is repeated for all the M-by-M image data.

The memory 1 which repeats the above-mentioned operation serves as a temporary buffer memory for input data. For obtaining the output Q (I, J) in the expression (3), input data D (I, J) as well as data from I−[N/2] to I+[N/2] for I and data from J−J[N/2] to J+[N/2] for J, are required. Concerning the input data occurring as the result of the raster scan, D (I+[N/2], J+[N/2]) is the latest data among the necessary data for obtaining Q (I, J) while the data D (I−[N/2]), J−[N/2]) is the earliest input data. When the latest data D (I+[N/2], J+[N/2]) is acquired, the expression (3) is calculated based on the N-by-N data extending from D (I−[N/2], J−[N/2]) to D (I+[N/2], J+[N/2]), thus determining Q (I, J). Therefore, the image data D (I, J) supplied from the input terminal a must be stored at the address (I+[N/2], J+[N/2]) of memory 1 before the filtered data can be acquired at the address (I', J'). The inventive digital filter further comprises an address generator 8, also shown in FIG. 6, which addresses the abovementioned points of storage in the memory 1.

The address generator 8 comprises a counter 12 which counts in the direction of the lines (or rows) indexed with I', and another counter 13 to count the direction of the raster (see FIG. 5) indexed with J'. Pulses generated concurrently with the input data are supplied to the address generator at the input terminal b and applied to the input of the counter 12 of which, the contents of which are increased by one each time image is supplied. When a pulse is supplied to the counter 12 after application of data for one line, namely, after the contents of the counter reaches the value M, a carry signal is delivered from the counter 12 which is initialized again, and at the same time, the carry signal is supplied to the counter 13, the output of which will be increased by one. When a pulse is supplied to the counter 13 such that the output reaches a value N after the above operation is done repeatedly, both the counters 12 and 13 are initialized.

Furthermore, the address generator comprises a memory 14 which stores a constant −N which designates a filter characteristic, as well as 0, [N/2] and −[N/2]. The address generator 8 also comprises an adder 15 which generates memory addresses I', I'+[N/2] and I'−[N/2], and another adder 16 which generates memory addresses J' and J'+[N/2]. The above-mentioned constant −N is delivered as output from the memory when an overflow signal is developed at the adder 16 (when the address thereof reaches a value above N), to always deliver a correct J'-directional position.

The system in FIG. 6 also comprises a memory 2 which is a one-dimensional memory for one line of data or M data. Repeating the following operation, this memory 2 also serves as a buffer memory to store a J'-directional (raster-directional) total sum $$\sum_{J'=1}^{N} D(I',J')$$

which has been stored in the memory 1. Before new image data is stored in the memory 1 at an address, old data having been stored at the same address is read out, supplied as input to the subtractor 3 and compared, for any difference, with data stored at the same I'-directional address that is, at the position of I'+[N/2]. The output of the subtractor 3 is supplied as input to the adder 4 where it added to the new image new input data D(I, J) and the output the adder 4 is then stored in the memory 2 at the same address as above. This operation for the data in memory 2 leads to an updating in that replacement of the old data in the the memory 1 with the new data updates memory 2. That is, the old data in memory at the corresponding I'-directional position is subtracted from this position within memory 2 and the new input data is added to this position, this being repeated for storage of each new data into the memory 1, thereby causing the memory 2 to always hold the, J-directional (raster-directional) total sum $$\sum_{J'=1}^{N} D(I',J')$$

at the addresses 1, 2, . . . , M, respectively.

The system shown in FIG. 6 further comprises a register 5. This is a register for the total sum of the N-by-N data surrounding the address (I', J') in the memory 1, and operates as follows:

The subtractor 6 develops the difference between the output from the register 5 and an output from the line memory 2. The output of the line memory 2 is the raster-directional sum at address (I'−[N/2]). An adder 7 is provided for addition of the output of the subtractor 6 and output from the adder 4. The output from adder 7 is stored in the register 5 for recurrent calculation at time of a next input image data at terminal a. The address (I−[N/2]) is delivered as output from the address generator 8.

In the above procedure, the register 5 stores the total sum of the N-by-N area surrounding the filtration point indicated at (I', J'), namely, the result of calculation of the following:

$$\sum_{k=-N/2}^{N/2} \sum_{l=-N/2}^{N/2} D(I'+k, J'+l)$$

Figure 3A:
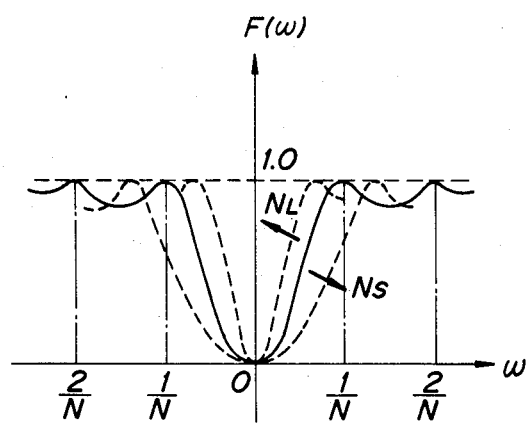
FIGS. 3 (A), (B) and (C) present characteristic curves of digital high-pass filtration.
Figure 3B:
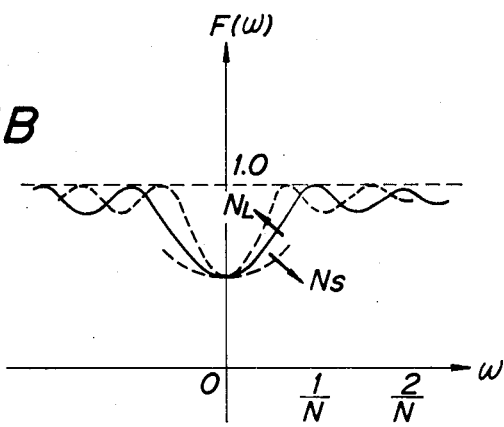
Figure 3C:
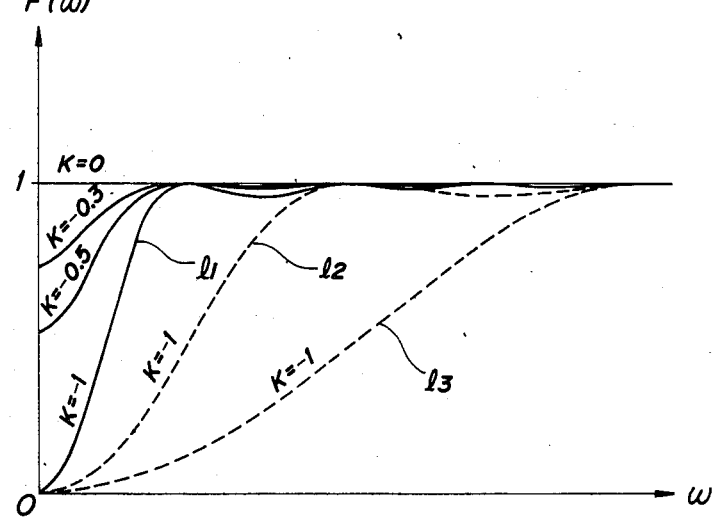
Figure 4A:
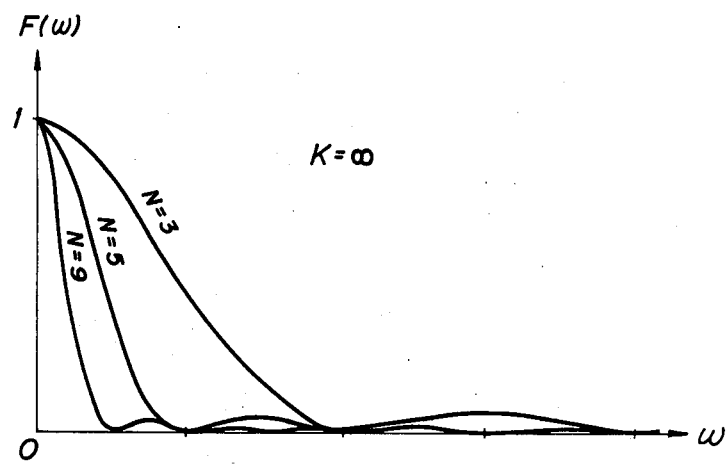
FIGS. 4 (A) and (B) depict the characteristic curves of digital low-pass filtration.
Figure 4B:
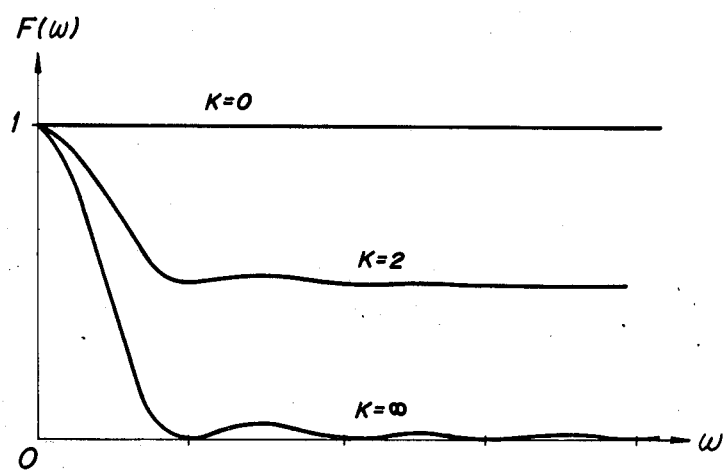

Another register 9 is provided to store in the form of K/N² the constant K which designates the filter characteristic. The constant is supplied to a multiplier 10 where it is multiplied by the total sum of the N-by-N area around the point (I', J'). The output of multiplier 10 is supplied to an adder 11. From the memory 1, data D (I', J') is read to the adder 11 where the above product and the data D (I', J') are added together. The calculation result of the expression (3) being the filtration result is delivered at the output terminal C of the adder 11. Connected to this output terminal C is a disc memory 20 which stores the digital filtration result. The contents of this memory 20 are displayed on a CRT (not shown) or utilized as data for calculation. The characteristic of the filter of the configuration having been described above is determined according to the values of N and K. In case $-1 \leq K < 0$, the filter serves as high-pass filter. When $0 < K$, it provides for low-pass filtration. The characteristics of the high-pass and low-pass filters are as shown in FIGS. 3 and 4, respectively. That is provide say, a variety of K and N values to a variety of filter characteristics.

According to the present invention, the N² additions having heretofore been necessary for acquisition of a total sum is reduced to only 4 additions and subtractions where the four additions and subtractions are done by the subtractors 3 and 6, and adders 4 and 7 in FIG. 6. These 4 additions and subtractions are independent of the N value of the filter characteristic. Thus the function of filtration is greatly improved and the time for calculation is considerably reduced.

The coordinates of the image shown in FIG. 1 do not correspond point-to-point to the coordinates of the buffer memory 1. Namely, the memory area of the buffer memory 1 is M by N, while the image in FIG. 1 takes an M-by-M area.

The raster-scanning procedure which will be explained in FIG. 7 which also provides an explanation of the relation between the coordinates of an image and buffer memory 1.

Figure 7:
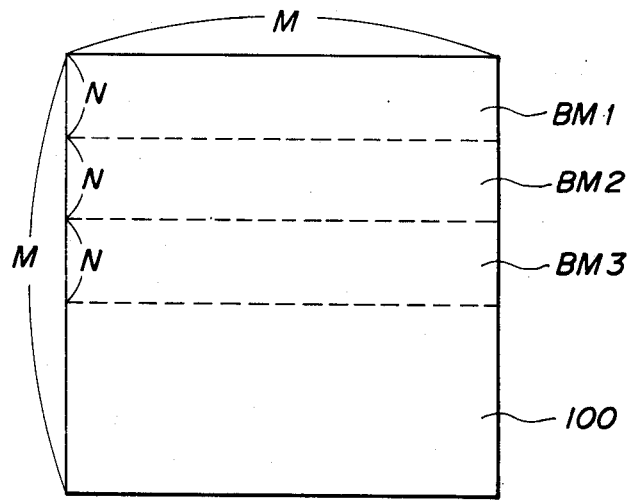
FIG. 7 shows the relation of an image with its blocks.

FIG. 7 shows an image 100 consisting of M-by-M pixels as shown in FIG. 1. From this image 100, a block BM1 which forms an image of M by N in size is read and stored into the buffer memory 1. However, the image of the M-by-N size is not parallely read and stored in one cycle, but is read while scanning the raster for each point, namely, while shifting the scanning point (I, J). Therefore, storage of a block BM1 of M by N in size into the buffer memory necessitates M-by-N read (scan) operations and M-by-N write operations. When this series of operations is over, the block BM1 will have been in the buffer memory 1.

A next block BM2 is read and stored into the buffer memory in the following procedure. First, data at the top position of the BM2 is read and stored at the top position or address of the buffer memory 1. At this time, the data at the top position of the preceding BM1 is deleted and the data at the top position of the BM2 is stored instead. Here the data has been updated. Subsequently, the scanning points of BM2 of the image 100 are scanned one after another, while deleting the data of the preceding BM1, so that the BM2 data obtained by the scanning is newly stored into the buffer memory. Storage of BM3 instead of the BM2 is done in a simimar procedure.

Figure 8:
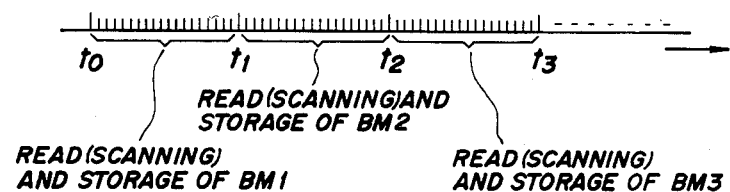
FIG. 8 shows the procedure of reading the image blocks in FIG. 7.
Figure 9:
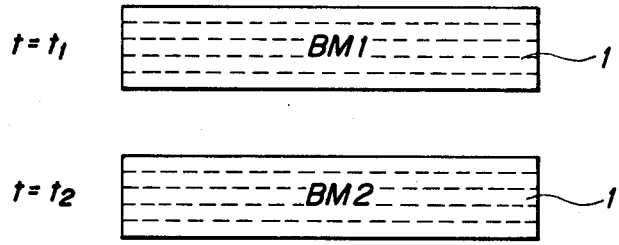
FIG. 9 shows the procedure of storing the image blocks into a buffer memory.

FIGS. 8 and 9 show the procedures of storage. In FIG. 8, $t_0$ to $t_1$ is a time during which BM1 is read and stored. During time $t_1$ to $t_2$, BM2 is read and stored during $t_2$ to $t_3$ BM3 is read and stored. A further block BMi (i=4, 5, . . . ) is similarly read and stored.

FIG. 9 illustrates the data stored into the buffer memory 1 as timed in FIG. 8. When $t=t_1$, storage of the BM1 is completed, and at $t=t_2$, the BM2 is completely stored into the buffer memory 1.

Figure 10:
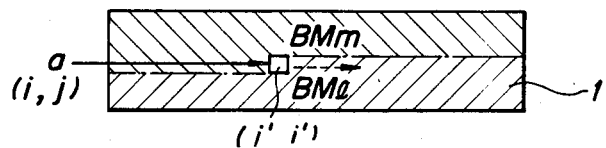
FIG. 10 shows the updating of image data in the buffer memory.

FIG. 10 shows the data updating in the buffer memory 1. Assume here, in case an image of the latest information a is to be stored into the buffer memory 1, that the information a belongs to a block BMm and it exists in the mid point in the block BMm, the write will be done as shown in FIG. 10. If the preceding block is taken as BMl, the data in a portion of the new block BMm and that in a portion of the preceding block BMl are coexistent in the buffer memory 1. The data of the BMm are stored one after another in the direction of solid-line arrow.

Now assume that a point of interest of the information a is (I, J) in FIG. 10. The storage point (write point) of the buffer memory 1 is not the (I, J) but a value (I', J') converted in accordance with the block unit where the relation between (I', J') and (I,J) is shown by the equation (4).

What is claimed is:

1. A digital filter for subjecting each of M×M picture elements to a filtration process where a parameter of each picture element is modified at least in accordance with the sum of the values of said parameter for each of N×N picture elements surrounding said picture element, said filter comprising:
    a buffer storage means for storing at least a portion of said M×M picture elements; and
    processing means responsive to at least one of the picture elements stored in said buffer storage means for effecting said filtration process including first subprocessing means responsive to said one picture element for obtaining said sum of the values of said parameter for each of the N×N picture elements in a time period which is independent of the value of N.

2. A digital filter as in claim 1 where said parameter of each picture element is the density thereof.

3. A digital filter as in claim 2 where the filtration process is represented by $$Q(I,J) = D(I,J) + \frac{K}{N^2} \sum_{k=-\left(\frac{N}{2}\right)}^{\left(\frac{N}{2}\right)} \sum_{l=-\left(\frac{N}{2}\right)}^{\left(\frac{N}{2}\right)} D(I+k, J+l)$$

where Q(I,J) is the filtered value of the density of the picture element located at the point (I,J) of the M×M picture elements, D(I,J) is the original density of said picture element, K is a constant which affects the characteristic of the filtration process; and D(I+k, J+l) is the density of one of the N×N picture elements surrounding the said picture element, said one picture element being located at the point (I+k, J+l) and [ ] is the Gaussian operator.

4. A digital filter as in claim 1 where said buffer storage means M×N of said storage elements.

5. A digital filter as in claim 1 where said buffer storage means includes a plurality of rows and a plurality of columns of locations for storing at least some of said picture elements and where said first subprocessing means includes (a) a first register having a plurality of memory locations at least equal in number to the number of columns in said buffer storage means where the I'-th of the latter memory locations stores the sum of the values stored in at least N of the locations in the I'-th column of the buffer storage memory means; and (b) a second register for storing the sum of the values stored in at least N of the locations of the first register to thereby store said sum of the values of said parameter for each of the N×N picture elements surrounding the picture element being subjected to the filtration process.

6. A digital filter as in claim 5 where buffer storage means includes M columns and N rows and thus M×N storage locations for the values of said parameters of the picture elements.

7. A digital filter as in claim 5 or 6 where said first sub-processing means includes (a) successive accessing means for successively accessing the values stored in successive rows of said buffer storage means where the values in each row are successively accessed and (b) first updating means for updating at least one of the sums stored in said first register each time one of the picture elements is subjected to the filtration process.

8. A digital filter as in claim 7 including storing means for storing said value of the parameter of one of said picture elements in one of the locations in the I'-th column of the buffer storage means and where said filter includes updating means for updating the sum stored in the I$^{th}$ location including (a) means for adding to said latter sum the value of the picture element being currently stored in said one location of the I$^{th}$ column, (b) means for subtracting from said latter sum the value of the picture element previously stored in said I'-th column to thereby obtain an updated sum for said I'-th column, and (c) means for storing said updated sum in the I'-th location of the first register.

9. A digital filter as in claim 8 where said first sub-processing means includes means for updating the sum stored in said second register including (a) means for adding to the latter sum the updated sum stored in the I'-th location of the first register, and (b) means for subtracting from the latter sum the sum stored in the (I'-[N/2])th location of the first register to thereby obtain an updated sum of the N×N values surrounding the value of the picture element currently being processed, the location of said latter value being (I'−[N/2], J'−[N/2]) where I' equals the number of the column and J' equals the number of the row of the buffer storage means.

10. A digital filter as in claim 9 where said processing means includes second sub-processing means including (a) multiplying means for multiplying said updated sum in the second register by a constant representative of the characteristic of the filtration process and (b) means for adding the result obtained by said multiplying means to the value of the picture element currently being processed to thereby effect the filtration process for the picture element currently being processed.

11. A digital filter as in claim 10 where the filtration process is represented by $$Q(I,J) = D(I,J) + \frac{K}{N^2} \sum_{k=-\left(\frac{N}{2}\right)}^{\left(\frac{N}{2}\right)} \sum_{l=-\left(\frac{N}{2}\right)}^{\left(\frac{N}{2}\right)} D(I+k, J+l)$$

where Q(I,J) is the filtered value of the density of the picture element located at the point (I,J) of the M×M picture elements; D(I,J) is the original density of said picture element, K is a constant which affects the characteristic of the filtration process; and D(I+k, J+l) is the density of one of the N×N picture elements surrounding the said picture element, said one picture element being located at the point (I+k, J+l) and [ ] is the Gaussian operator.

12. A digital filter as in claim 10 where said constant representative of the filtration process characteristic is equal to K/N² where K ≧ −1.

13. A digital filter as in claim 12 where −1 ≦ K < 0 to thereby effect a high-pass filter characteristic.

14. A digital filter as in claim 12 where K > 0 to thereby effect a low-pass filter characteristic.

15. A digital filter as in claim 12 where said M×M picture elements are present on a two-dimensional digital picture where M > N, where said buffer memory means includes N rows and M columns, and where said digital filter includes means for raster-scanning the picture elements of said picture and said storing means includes means for successively storing the values of the parameters of the raster-scanned picture elements in said buffer memory means in the order they are successively accessed by said successive accessing means and for replacing the values stored in the buffer memory means with new values of the raster-scanned picture elements each time the buffer memory means is filled, the values being stored in the same order with each filling of the buffer memory means.

16. A digital filter for effecting filtration in N×N filter areas by raster-scanning a two-dimensional digital picture having M×M picture elements where N<M, comprising:

a buffer memory for storing data respectively corresponding to M×N of said picture elements, said buffer memory having M columns and N rows;

means for raster-scanning said picture elements of the two-dimensional digital picture at respective scanning points (I,J) (where I=1, 2, ..., M; J=1, 2, ..., M) and successively storing the said data respectively corresponding to the raster-scanned, picture elements into successive locations of said buffer memory (I',J') (where I'=1, 2, ..., M and J'=1, 2, ..., N) where the data currently being stored in the buffer memory is stored in location (I',J');

means for renewing the data in said buffer memory each time it is filled, said data being renewed in the same order data was filled into the memory the first time;

a first register having M locations respectively corresponding to the M columns of the buffer memory where said locations extend from I'=1, 2, 3, ..., M;

means for storing in the M locations of the first register the respective sums of the M columns of the buffer memory;

means for updating the sum stored in the I'-th location of the first register including (a) means for adding thereto the value of the data currently being stored in (I',J') of the buffer memory, (b) means for subtracting therefrom the value of the data previously stored in (I',J'), and (c) means for storing the updated sum in the I'-th location of the first register;

a second register for storing the sum of the values stored in at least N of the locations of the first register to thereby store said sum of the values of said data for each of the N×N picture elements surrounding the picture element being subjected to the filtration process;

means for updating the sum stored in said second register including (a) means for adding to the latter sum the updated sum stored in the I'-th location of the first register, (b) means for subtracting from the latter sum the sum stored in the $(I'-2/N-1)^{th}$ location of the first register to thereby obtain an updated sum of N×N values surrounding the value of the picture element currently being processed, the location of said latter value being (I'−N/2, J'−N/2) where I' equals the number of the column and J' equals the number of the row of the buffer storage means; and multiplying means for multiplying said updated sum in the second register by a constant representative of the characteristic of the filtration process and means for adding the result obtained by said multiplying means to the value of the picture element currently being processed to thereby effect the filtration process for the picture element currently being processed.

17. A digital filter as in claim 16 where the filtration process is represented by $$Q(I,J) = D(I,J) + \frac{K}{N^2} \sum_{k=-\left(\frac{N}{2}\right)}^{\left(\frac{N}{2}\right)} \sum_{l=-\left(\frac{N}{2}\right)}^{\left(\frac{N}{2}\right)} D(I+k, J+l)$$

where Q(I,J) is the filtered value of the density of the picture element located at the point (I,J) of the M×M picture elements, D(I,J) is the original density of said picture element, K is a constant which affects the characteristic of the filtration process; and D(I+k, J+l) is the density of one of the N×N picture elements surrounding the said picture element, said one picture element being located at the point (I+k, J+l) and [ ] is the Gaussian operator.

18. A digital filter as in claim 16 where said constant representative of the filtration process characteristic is equal to K/N² where K ≧ −1.

19. A digital filter as in claim 18 where −1 ≦ K < 0 to thereby effect a high-pass filter characteristic.

20. A digital filter as in claim 18 where K > 0 to thereby effect a low-pass filter characteristic.

21. A digital filter for filtering an M-by-M pixels matrix of a two dimensional image in a N-by-N length filter where the pixels of the matrix are successively scanned, said filter comprising a buffer memory having M-by-N locations defined by column locations 1,2, - - - ,M and row locations 1,2, - - - N;

means for successively applying the density values (D) of the scanned pixels to successive locations in the buffer memory, the location (I'+[N/2], J'+[N/2]) being the location of the most recently applied density value where [ ] is the Gaussian operator and where the location of the density value currently having its filtration value Q(I',J') determined is (I',J') where I'=1, 2, - - - M and J'=1,2, - - - N, said last-mentioned location being the filtering point of the data D(I', J').

address generating means for generating the values of I',J', I'+[N/2], J'+[N/2] and I'−[N/2], respectively;

a first register having a storage area of one-by-M where the successive locations thereof respectively correspond to the column locations 1, 2, - - -, M of the buffer memory;

a first means for reading data stored in said first register at a location corresponding to said value (I'+N/2) designated by said address generating means and for subtracting data having been previously stored at said location (I'+[N/2], J'+[N/2]) of said buffer memory designated by said address generating means from said data read from the first register to obtain first subtracting data, and for adding the data of said most recently applied density value to said first subtraction data to obtain first addition data and for storing the first addition data at said location of said first register corresponding to the column address (I'+[N/2]);

a second register; and a second means for reading data stored in said second register, and for subtracting data stored in said first register at a location corresponding to an address (I'−[N/2]) designated by said address generating means from the data read from said second register to obtain second subtraction data, and for adding said first addition data to said second subtraction data to obtain second addition data, and for storing said second addition data at said second register, and for multiplying the second addition data by a weighting factor, and for adding said data D(I', J') stored at an address (I',J') of said buffer memory to the data resulting from said multiplication to obtain third data—that is, said Q(I', J').

* * * * *